(12) United States Patent
Ewald

(10) Patent No.: US 12,107,027 B2
(45) Date of Patent: Oct. 1, 2024

(54) POWER MODULE FOR OPERATING AN ELECTRIC VEHICLE DRIVE WITH IMPROVED TEMPERATURE DETERMINATION OF THE POWER SEMICONDUCTORS

(71) Applicant: ZF Friedrichshafen AG, Friedrichshafen (DE)

(72) Inventor: Ake Ewald, Bayreuth (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 333 days.

(21) Appl. No.: 17/362,540

(22) Filed: Jun. 29, 2021

(65) Prior Publication Data

US 2021/0407880 A1  Dec. 30, 2021

(30) Foreign Application Priority Data

Jun. 30, 2020  (DE) .................... 10 2020 208 154.9

(51) Int. Cl.
| | | |
|---|---|---|
| H01L 23/367 | (2006.01) | |
| H01L 23/473 | (2006.01) | |
| H01L 23/50  | (2006.01) | |
| H01L 25/07  | (2006.01) | |
| H01L 25/16  | (2023.01) | |
| H02M 7/00   | (2006.01) | |
| H05K 7/20   | (2006.01) | |

(52) U.S. Cl.
CPC ............ *H01L 23/367* (2013.01); *H01L 23/50* (2013.01); *H01L 25/072* (2013.01); *H01L 25/16* (2013.01); *H02M 7/003* (2013.01); *H01L 23/473* (2013.01); *H05K 7/20927* (2013.01)

(58) Field of Classification Search
CPC ..... H01L 23/367; H01L 23/473; H01L 23/50; H01L 25/072; H01L 25/16; H02M 7/003; H05K 7/20927
See application file for complete search history.

(56) References Cited

U.S. PATENT DOCUMENTS

| | | | | |
|---|---|---|---|---|
| 5,111,280 A  | * | 5/1992 | Iversen ................. | H01L 23/427 257/713 |
| 6,373,705 B1 | * | 4/2002 | Koelle .................... | H01L 23/36 174/16.3 |
| 2007/0114665 A1 | * | 5/2007 | Bayerer ................ | H01L 25/072 257/E25.016 |

(Continued)

FOREIGN PATENT DOCUMENTS

| | | |
|---|---|---|
| DE | 19900603 A1 | 9/2000 |
| DE | 102004018469 B3 | 10/2005 |

OTHER PUBLICATIONS

Search Report issued in German Patent Application No. DE 10 2020 208 154.9 dated Jan. 19, 2021 (10 pages).

*Primary Examiner* — Herve-Louis Y Assouman
*Assistant Examiner* — Christopher M Roland
(74) *Attorney, Agent, or Firm* — Crowell & Moring LLP

(57) ABSTRACT

A power module for operating an electric vehicle drive, comprising: numerous semiconductor components; a heatsink for discharging heat generated by the semiconductor components; a DC link capacitor connected in parallel to the semiconductor components; a DC link line electrically connecting the DC link capacitor to the semiconductor components; wherein the DC link line is at least partially located in a hole formed in the heatsink.

17 Claims, 2 Drawing Sheets

(56) References Cited

U.S. PATENT DOCUMENTS

2013/0009168 A1* 1/2013 Tsuchiya ............... H01L 23/473
　　　　　　　　　　　　　　　　　　　　　257/77
2013/0271941 A1* 10/2013 Guan ................. H05K 7/14329
　　　　　　　　　　　　　　　　　　　　　361/811

* cited by examiner

POWER MODULE FOR OPERATING AN ELECTRIC VEHICLE DRIVE WITH IMPROVED TEMPERATURE DETERMINATION OF THE POWER SEMICONDUCTORS

CROSS-REFERENCE TO RELATED APPLICATIONS

This application claims priority from German Application No. DE 10 2020 208 154.9, filed on Jun. 30, 2020, the entirety of which is hereby fully incorporated by reference herein.

TECHNICAL FIELD

The present invention relates to the field of electric mobility, in particular the power modules for operating an electric vehicle drive.

TECHNICAL BACKGROUND

Power modules, in particular integrated power modules, are increasingly used in motor vehicles. These power modules are used, e.g. in DC/AC inverters, which supply a multiphase alternating current to electric motors. A direct current generated by a DC power source, e.g. a battery, is converted for this into a multiphase alternating current. The power modules are based on power semiconductors, in particular transistors such as IGBTs, MOSFETs and HEMTs. Other uses are DC/DC converters and AC/DC converters and transformers.

Power switches used in a bridge circuit are normally formed by the power semiconductors. A common example is the so-called half-bridge, which comprises a high-side component and a low-side component. The high-side and low-side components each comprise one or more power switches, specifically high-side power switches and low-side power switches. Through targeted switching of the high-side and low-side power switches, the direction of the current (output current) generated at the output of the power module can be alternated in very short cycles between a positive current direction and a negative current direction. In the case of a DC/AC inverter this allows for a so-called pulse-width modulation for generating an alternating current based on a direct current supplied to the input of the power module.

The fundamental object of the invention is therefore to create a power module in which the operating temperature of the power semiconductor can be detected with greater precision.

This object is achieved by a power module and a method according to the independent claims.

The power module is used in the framework of this invention to operate an electric vehicle drive, in particular in an electric vehicle and/or a hybrid vehicle. The power module is preferably used in a DC/AC inverter. In particular, the power module is used to supply electric current to an electric machine, e.g. an electric motor, and/or a generator. A DC/AC inverter is used to generate a multiphase alternating current from a direct current generated by a DC voltage from an energy source, e.g. a battery.

The power module contains numerous semiconductor components, or chips, for generating an output current based on the input current by controlling the individual semiconductor components. The semiconductor components are controlled by a control electronics, which contains one or more printed circuit boards populated with numerous electronic components. The control electronics preferably comprises a controller component for generating a control signal based on an operating state of the power module and a driver for controlling the power switches based on the control signal. The control can be based on a so-called pulse-width modulation. In the case of an inverter, the input current is a direct current, and the output current is an alternating current.

When the power module is in operation, high currents are frequently sent through the individual semiconductor components. This is the case in particular with high voltage applications, i.e. 400V and 800V applications. It is therefore important to discharge heat resulting from the operation of the power module, to prevent damage to the semiconductor components due to overheating. A heatsink is normally used for this, to which the semiconductor components are thermally coupled.

The individual semiconductor components are normally combined to form so-called topological switches. Each topological switch has numerous semiconductor components connected in parallel, which preferably form a complete half-bridge with a high side and a low side within the respective topological switch. As the requirements of the amount of power to be provided to the vehicle by the electric drive increase, the amount of current that is to be transferred by the power module also increases. When the voltage remains at least the same, this requires more topological switches.

With the power modules known from the prior art, increasing the number of topological switches results in the various semiconductor components only being contacted at the DC side to a certain extent, such that leakage inductance is kept lower due to the impedance in the lines. Furthermore, these known power modules frequently have lines of different lengths, which therefore exhibit different leakage inductances. Leakage inductances can be linked to quick switching and result in voltage jumps, which may exceed the overvoltage of the semiconductor components, thus damaging them.

The technical object of the invention is therefore to more effectively prevent voltage jumps in the power module caused by leakage inductances.

This object is achieved according to the invention by the power module, heatsink, and inverter according to the independent claims.

The power module in the framework of this invention is used to operate an electric vehicle drive, in particular in an electric vehicle and/or hybrid vehicle. The power module is preferably used in a DC/AC inverter. In particular, the power module is used to provide current to an electric machine, e.g. an electric motor and/or generator. A DC/AC inverter is used to generate a multiphase alternating current from a direct current generated from a DC voltage from an energy source, i.e. a battery.

The power module has numerous semiconductor components, or chips, that generate an output current based on the input current by controlling the individual semiconductor components. The topological switches are controlled by a control electronics, which preferably has one or more printed circuit boards populated by numerous electronic components. The control electronics preferably comprises a controller component for generating a control signal based on an operating state of the power module and a driver for controlling the semiconductor components based on the control signal. The control can be based on a so-called pulse-width modulation. In the case of an inverter, the input current is a direct current, and the output current is an alternating current.

The numerous semiconductor components preferably form one or more half-bridges. Each half-bridge can be understood to be a topological switch comprising numerous semiconductor components connected in parallel. Each topological switch comprises a high side and a low side, which is connected to the high side in series. The semiconductor components each comprise an IGBT, MOSFET, or HEMT. The fundamental semiconductor material for the respective power semiconductor component preferably comprises a so-called wide bandgap semiconductor (semiconductor with a wide bandgap), e.g. silicon carbide (SiC) or gallium nitride (GaN), and/or it can comprise crystalline and/or amorphous silicon.

The power module also comprises a heatsink thermally coupled to the semiconductor components. Coolant lines are preferably formed in the heatsink through which a coolant, i.e. water, flows. Furthermore, a DC link capacitor can be connected in parallel to the topological switches for smoothing the input voltage.

A DC link line comprising numerous busbars electrically connects the DC link capacitor to the semiconductor components. The DC link line is at least partially located in a hole formed in the heatsink.

This shortens the DC link line, because it does not need to be wound around the heatsink to connect with the semiconductor components. According to the invention, the DC link line can lie at least in part in the hole formed in the heatsink. This reduces the leakage inductance in the power module, such that the probability of voltage jumps at the semiconductor components, which can be attributed to the coupling between the leakage inductance and the changes in current caused by switching the semiconductor components, is reduced.

Furthermore, the equal lengths of the DC link line, and therefore an equal inductance between the various semiconductor components, is facilitated by this construction according to the invention. This simplifies the targeted control of the semiconductor components and the generation of the desired output current.

Advantageous embodiments and developments are described in the dependent claims.

Embodiments shall now be described by way of example and in reference to the attached drawings. Therein:

The same reference symbols are used for the same or functionally similar elements in the drawings.

Figure 1:
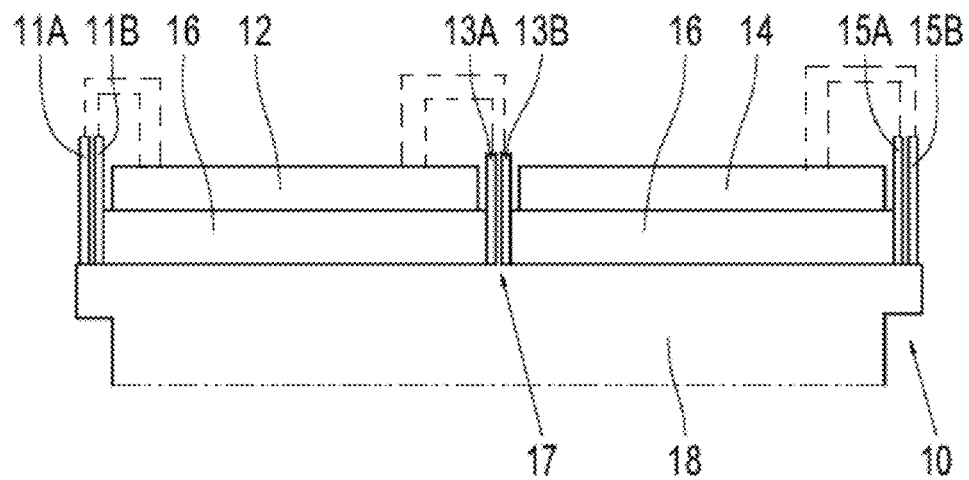
FIG. 1 shows a schematic illustration of a power module according to an embodiment.
Figure 2:
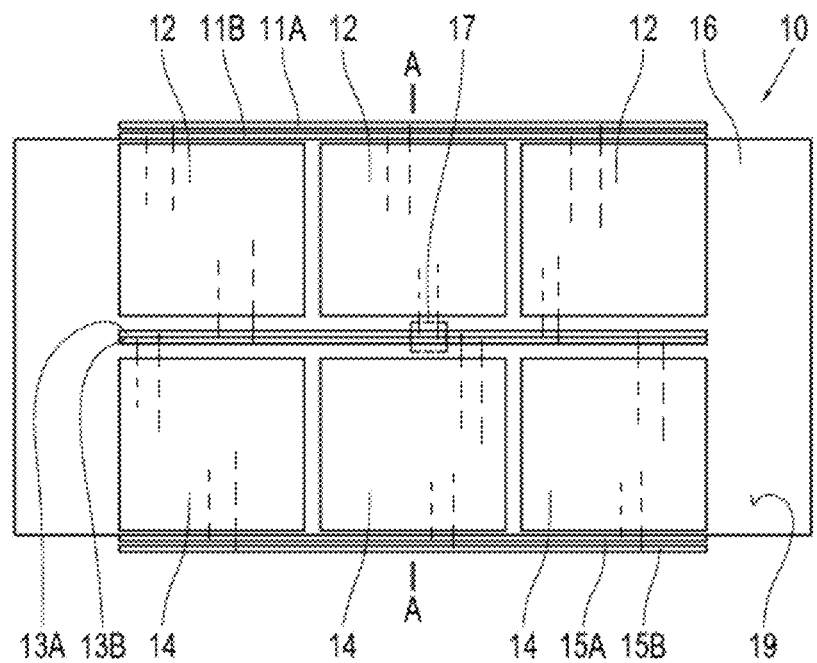
FIG. 2 shows a schematic illustration of a circuitry of the power module in FIG. 1.

FIG. 1 shows a schematic sectional view of a power module 10 according to an embodiment. The cutting plane A-A is shown in FIG. 2. The power module 10 comprises numerous topological switches 12, 14, each of which has numerous semiconductor components connected in parallel. The power module 10 comprises a DC link capacitor 18 for smoothing the input voltage, which is powered by an energy source (e.g. a battery) in the power module 10. A heatsink 16 is located between the topological switches 12, 14 and the DC link capacitor 18 for discharging the heat generated by the topological switches 12, 14 when in operation, and to cool the semiconductor components. The DC link capacitor 18 is connected in parallel to the topological switches 12, 14.

There is a DC link line between the DC link capacitor 18 and the semiconductor components in the topological switches 12, 14, which comprises numerous first busbars 11A, 13A, 15A for electrically connecting the semiconductor components to a positive potential, and numerous second busbars 11B, 13B, 15B for electrically connecting the semiconductor components to a negative potential, in the embodiment shown herein. The heatsink has a hole 17 in the middle that partially accommodates the busbars 13A, 13B. The DC link line is therefore located partially in the interior of the heatsink 16. The busbars 11A, 11B, 13A, 13B, 15A, 15B extend from the DC link capacitor 18, in which the busbars 11A, 11B, 13A, 13B, 15A, 15B are connected to the respective potentials, and are directed upward, substantially perpendicular, above the surface 19 (see FIG. 2) of the heatsink. The hole 17 therefore forms a passage through the heatsink. As a result, it is easy to obtain contact to the semiconductor components inside the power module 10, thus ensuring that the lines are of equal length.

FIG. 2 shows a top view of the power module 10. The power module 10 in this exemplary embodiment has six topological switches 12, 14, which are assigned to three current phases, such that there are two topological switches 12, 14 for each current phase (in FIG. 2, the left, middle, and right columns of the topological switches). The busbars 11A, 11B, 15A, 15B are located on the sides of the heatsink 16 and run along the edges of the heatsink 16. The busbars 13A, 13B are located between the upper topological switches 12 and the lower topological switches 14. The various segments of the DC link line assigned to all three current phases therefore merge together on a surface 19 of the heatsink 16, on which the topological switches 12, 14 are placed. Alternatively, these various segments of the DC link line can be placed inside the heatsink 16 and/or the DC link capacitor 18.

Figure 3:
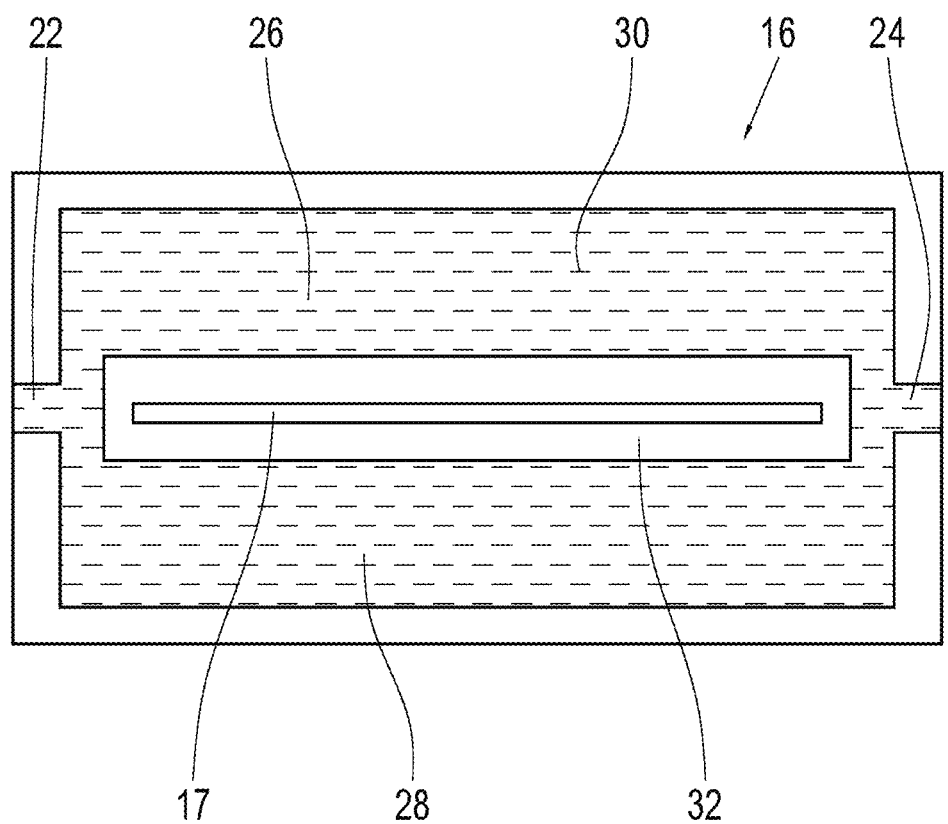
FIG. 3 shows a schematic illustration of a heatsink according to an embodiment.

FIG. 3 shows a schematic illustration of the heatsink 16. The heatsink 16 is shown here in a horizontal sectional view. The heatsink 16 comprises a coolant intake 22 and a coolant outlet 24, and an intermediate space located therebetween, through which a coolant 30 flows. The intermediate space is divided into two cooling channels 26, 28 by the hole 17 and the wall 32 encompassing it. A first cooling channel 26 is primarily configured to cool the upper topological switch 12, and the second cooling channel 28 is primarily configured to cool the lower topological switch 14. When there is a large number of topological switches, as in the embodiment shown by way of example in FIG. 2, further cooling channels can be created by forming additional holes and walls.

| Reference Symbols | |
|---|---|
| 10 | power module |
| 11A, 13A, 15A | first busbars |
| 11B, 13B, 15B | second busbars |
| 12, 14 | topological switches |
| 16 | heatsink |
| 17 | hole |
| 18 | DC link capacitor |
| 19 | surface |
| 22 | coolant intake |
| 24 | coolant outlet |
| 26 | first cooling channel |
| 28 | second cooling channel |
| 30 | coolant |
| 32 | wall |

The invention claimed is:

1. A power module for operating an electric vehicle drive, comprising:
   a plurality of semiconductor components;
   a heatsink for discharging heat generated by the semiconductor components;
   a DC link capacitor connected in parallel to the semiconductor components; and
   a DC link line electrically connecting the DC link capacitor to the semiconductor components;
   wherein the DC link line is at least partially located in a hole extending completely through the heatsink,
   wherein the hole in the heatsink is disposed between an intake and an outlet in the heatsink,
   wherein an inner space in the heatsink is divided, by the hole, into a first cooling channel and a second cooling channel, through which a coolant flows around the hole,
   wherein the first cooling channel is configured to cool a first semiconductor component of the plurality of semiconductor components, and
   wherein the second cooling channel is configured to cool a second semiconductor component of the plurality of semiconductor components.

2. The power module according to claim 1, wherein the DC link capacitor is located on a side of the heatsink facing away from the semiconductor components.

3. The power module according to claim 2, wherein the hole forms a passage through which the DC link line passes from the DC link capacitor to the plurality of semiconductor components.

4. The power module according to claim 2, wherein the plurality of semiconductor components forms at least two topological switches, each of which comprises some of the plurality of semiconductor components connected in parallel, wherein the DC link line is located in an intermediate space in the heatsink between the at least two topological switches.

5. The power module according to claim 1, wherein the hole forms a passage through which the DC link line passes from the DC link capacitor to the semiconductor components.

6. The power module according to claim 1, wherein the plurality of semiconductor components forms at least two topological switches, each of which comprises some of the plurality of semiconductor components connected in parallel, wherein the DC link line is located in an intermediate space in the heatsink between the at least two topological switches.

7. The power module according to claim 1, wherein the plurality of semiconductor components is assigned to a plurality of current phases, wherein the DC link line has a plurality of segments, each of which is assigned to one of the plurality of current phases.

8. The power module according to claim 7, wherein the plurality of segments of the DC link line are electrically joined on a surface of the heatsink facing away from the DC link capacitor.

9. The power module according to claim 7, wherein the plurality of segments of the DC link line are electrically joined in the heatsink.

10. The power module according to claim 7, wherein the plurality of segments of the DC link line are electrically joined by the DC link capacitor.

11. The power module according to claim 7, wherein the DC link capacitor is located on a side of the heatsink facing away from the plurality of semiconductor components.

12. The power module according to claim 7, wherein the hole forms a passage through which the DC link line passes from the DC link capacitor to the plurality of semiconductor components.

13. The power module according to claim 7, wherein the plurality of semiconductor components forms at least two topological switches, each of which comprises some of the plurality of semiconductor components connected in parallel, wherein the DC link line is located in an intermediate space in the heatsink between the at least two topological switches.

14. The power module according to claim 7, wherein the plurality of semiconductor components is assigned to at least one of three, six, nine, or twelve current phases.

15. A heatsink for a power module, wherein the heatsink discharges heat generated by semiconductor components, wherein the heatsink has an internal hole for at least partially accommodating a DC link line for the power module, wherein the internal hole extends completely through the heatsink, wherein the internal hole in the heatsink is disposed between an intake and an outlet in the heatsink, wherein an inner space in the heatsink is divided by the internal hole into a first cooling channel and a second cooling channel, through which a coolant flows around the internal hole, wherein the first cooling channel is configured to cool a first semiconductor component, and wherein the second cooling channel is configured to cool a second semiconductor component.

16. An inverter, comprising the heatsink according to claim 15.

17. An inverter, comprising the power module according to claim 1.

* * * * *